United States Patent
Eberlein et al.

(10) Patent No.: US 8,138,075 B1
(45) Date of Patent: Mar. 20, 2012

(54) SYSTEMS AND METHODS FOR THE MANUFACTURE OF FLAT PANEL DEVICES

(76) Inventors: Dietmar C. Eberlein, Wappingers Falls, NY (US); Robert H. Detig, New Providence, NJ (US)

( * ) Notice: Subject to any disclaimer, the term of this patent is extended or adjusted under 35 U.S.C. 154(b) by 1445 days.

(21) Appl. No.: 11/671,406

(22) Filed: Feb. 5, 2007

Related U.S. Application Data

(60) Provisional application No. 60/765,360, filed on Feb. 6, 2006.

(51) Int. Cl.
- *H01L 21/00* (2006.01)
- *H01L 21/20* (2006.01)
- *H01L 21/3205* (2006.01)
- *H01L 21/4763* (2006.01)

(52) U.S. Cl. .... 438/587; 438/584; 438/34; 257/E21.476

(58) Field of Classification Search .................. 438/34, 438/584, 587; 257/E21.476
See application file for complete search history.

(56) References Cited

U.S. PATENT DOCUMENTS

| | | | |
|---|---|---|---|
| 6,036,889 A | 3/2000 | Kydd et al. | |
| 6,250,984 B1 | 6/2001 | Jin et al. | |
| 6,781,612 B1 | 8/2004 | Detig et al. | |
| 6,815,139 B2 | 11/2004 | Aa | |
| 2002/0130353 A1 | 9/2002 | Lieber et al. | |
| 2004/0173506 A1 | 9/2004 | Doktycz et al. | |
| 2004/0232411 A1 | 11/2004 | Nakamura | |
| 2005/0161664 A1 | 7/2005 | Hirai | |
| 2005/0162354 A1 | 7/2005 | Osame et al. | |
| 2005/0162366 A1 | 7/2005 | Moriya et al. | |
| 2005/0163932 A1 | 7/2005 | Zschieschang et al. | |
| 2005/0163938 A1 | 7/2005 | Yamazaki et al. | |
| 2005/0164019 A1 | 7/2005 | Liu et al. | |
| 2005/0170076 A1 | 8/2005 | Seki et al. | |
| 2005/0170202 A1 | 8/2005 | Tamao et al. | |
| 2005/0170550 A1 | 8/2005 | Seki et al. | |
| 2005/0170621 A1 | 8/2005 | Kim et al. | |
| 2005/0173701 A1 | 8/2005 | Kawase et al. | |
| 2005/0179036 A1 | 8/2005 | Yamazaki et al. | |
| 2005/0181533 A1 | 8/2005 | Kawase et al. | |
| 2005/0184659 A1 | 8/2005 | Ibe | |
| 2005/0186403 A1 | 8/2005 | Seki et al. | |
| 2005/0189537 A1 | 9/2005 | Scheifers et al. | |
| 2005/0189876 A1 | 9/2005 | Yamazaki et al. | |
| 2005/0194588 A1 | 9/2005 | Sasaki et al. | |
| 2005/0194894 A1 | 9/2005 | Sato | |
| 2005/0196710 A1 | 9/2005 | Shiroguchi et al. | |
| 2005/0196711 A1 | 9/2005 | Shiroguchi et al. | |
| 2005/0197030 A1 | 9/2005 | Yamazaki et al. | |
| 2005/0202348 A1 | 9/2005 | Nakayama et al. | |

(Continued)

*Primary Examiner* — Alexander Ghyka
*Assistant Examiner* — Seahvosh Nikmanesh
(74) *Attorney, Agent, or Firm* — Steven M. Hoffberg; Ostrolenk Faber LLP

(57) ABSTRACT

A backplane having a circuit array having at least one region comprising a substrate having a conductive plane under a dielectric surface, a first conductive layer on said dielectric surface, a selectively disposed insulator disposed over said first conductive layer, and a second conductive layer disposed on said insulator, wherein said first conductive layer is electrically insulated from said second conductive layer, said first conductive layer being formed electrographically, and said second conductive layer being formed by a process comprising selective deposition of liquid droplets, which are then solidified. The second conductive layer may be formed electrographically or by a raster deposition process. The backplane preferably forms an active matrix for a flat panel display using organic semiconductor active elements.

22 Claims, 8 Drawing Sheets

U.S. PATENT DOCUMENTS

| | | |
|---|---|---|
| 2005/0205861 A1 | 9/2005 | Bao et al. |
| 2005/0208332 A1 | 9/2005 | Chin et al. |
| 2005/0211975 A1 | 9/2005 | Kawasaki et al. |
| 2005/0214688 A1 | 9/2005 | Yamamoto et al. |
| 2005/0215067 A1 | 9/2005 | Mori |
| 2005/0218450 A1 | 10/2005 | Fukui |
| 2005/0218791 A1 | 10/2005 | Kawase |
| 2005/0218819 A1 | 10/2005 | Eida |
| 2005/0221203 A1 | 10/2005 | Fujii |
| 2005/0230678 A1 | 10/2005 | Cao et al. |
| 2005/0230752 A1 | 10/2005 | Kanno et al. |
| 2005/0231555 A1 | 10/2005 | Nakamura et al. |
| 2005/0231564 A1 | 10/2005 | Nakamura et al. |
| 2005/0233491 A1 | 10/2005 | Hirai |
| 2005/0236614 A1 | 10/2005 | Parker |
| 2005/0242345 A1 | 11/2005 | Bao |
| 2005/0242713 A1 | 11/2005 | Yamazaki |
| 2005/0243079 A1 | 11/2005 | Ozaki |
| 2005/0244995 A1 | 11/2005 | Fukuchi et al. |
| 2005/0245078 A1 | 11/2005 | Ohnuma et al. |
| 2005/0247928 A1 | 11/2005 | Unno |
| 2005/0247978 A1 | 11/2005 | Weng et al. |
| 2005/0249970 A1 | 11/2005 | Suzuri et al. |
| 2005/0250244 A1 | 11/2005 | Li et al. |
| 2005/0255616 A1 | 11/2005 | Childs et al. |
| 2005/0258417 A1 | 11/2005 | Minakata |
| 2005/0258422 A1 | 11/2005 | Koo et al. |
| 2005/0258771 A1 | 11/2005 | Kang et al. |
| 2005/0259053 A1 | 11/2005 | Iwabuchi |
| 2005/0259121 A1 | 11/2005 | Miyagawa |
| 2005/0260439 A1 | 11/2005 | Shiang et al. |
| 2005/0260452 A1 | 11/2005 | Ise et al. |
| 2005/0263765 A1 | 12/2005 | Maekawa |
| 2005/0266687 A1 | 12/2005 | Morimoto |
| 2005/0269562 A1 | 12/2005 | Yang et al. |
| 2005/0269568 A1 | 12/2005 | Koo et al. |
| 2005/0274945 A1 | 12/2005 | Fallis et al. |
| 2005/0274946 A1 | 12/2005 | Yoshida et al. |
| 2005/0274954 A1 | 12/2005 | Tanaka et al. |
| 2005/0275056 A1 | 12/2005 | Forrest |
| 2005/0276115 A1 | 12/2005 | Yamaguchi et al. |
| 2005/0276981 A1 | 12/2005 | Ong et al. |
| 2005/0277234 A1 | 12/2005 | Brandon |
| 2005/0277760 A1 | 12/2005 | Ong et al. |
| 2005/0277776 A1 | 12/2005 | Liu et al. |
| 2005/0280002 A1 | 12/2005 | Kang et al. |
| 2005/0280359 A1 | 12/2005 | Liu et al. |
| 2005/0282068 A1 | 12/2005 | Liu et al. |
| 2005/0285099 A1 | 12/2005 | Bao et al. |
| 2005/0285101 A1 | 12/2005 | Hanson et al. |
| 2005/0285114 A1 | 12/2005 | Kang et al. |
| 2005/0285830 A1 | 12/2005 | Iwabuchi |
| 2006/0006378 A1 | 1/2006 | Hirai |
| 2006/0006380 A1 | 1/2006 | Shin et al. |
| 2006/0006381 A1 | 1/2006 | Kelley et al. |
| 2006/0007520 A1 | 1/2006 | Takakuwa et al. |
| 2006/0008956 A1 | 1/2006 | Yudasaka et al. |
| 2006/0009614 A1 | 1/2006 | Yamahara et al. |
| 2006/0011889 A1 | 1/2006 | Cao et al. |
| 2006/0011909 A1 | 1/2006 | Kelley et al. |
| 2006/0012289 A1 | 1/2006 | Shiang |
| 2006/0012290 A1 | 1/2006 | Kang |
| 2006/0012294 A1 | 1/2006 | Christensen |
| 2006/0012296 A1 | 1/2006 | Eida et al. |
| 2006/0013549 A1 | 1/2006 | Shtein et al. |
| 2006/0014365 A1 | 1/2006 | Kugler et al. |
| 2006/0017659 A1 | 1/2006 | Ogawa et al. |
| 2006/0024860 A1 | 2/2006 | Wada et al. |
| 2006/0027800 A1 | 2/2006 | MacPherson et al. |
| 2006/0027806 A1 | 2/2006 | Koo et al. |
| 2006/0027838 A1 | 2/2006 | Koo et al. |
| 2006/0027860 A1 | 2/2006 | Nomoto |
| 2006/0030067 A1 | 2/2006 | Huang et al. |
| 2006/0033086 A1 | 2/2006 | Gerlach |
| 2006/0033105 A1 | 2/2006 | Fujii et al. |
| 2006/0033428 A1 | 2/2006 | Yu et al. |
| 2006/0036065 A1 | 2/2006 | Xiao et al. |
| 2006/0038174 A1 | 2/2006 | Maekawa |
| 2006/0038804 A1 | 2/2006 | Hayakawa et al. |
| 2006/0040135 A1 | 2/2006 | Morii |
| 2006/0040435 A1 | 2/2006 | Morisue et al. |
| 2006/0043346 A1 | 3/2006 | Kodas et al. |
| 2006/0043359 A1 | 3/2006 | Masuda et al. |
| 2006/0043432 A1 | 3/2006 | Kawai et al. |
| 2006/0044229 A1 | 3/2006 | Yamazaki et al. |
| 2006/0044299 A1 | 3/2006 | Wang et al. |
| 2006/0045959 A1 | 3/2006 | Yasukawa et al. |
| 2006/0049395 A1 | 3/2006 | Kobayashi |
| 2006/0049398 A1 | 3/2006 | Russel et al. |
| 2006/0054883 A1 | 3/2006 | Hanna et al. |
| 2006/0054884 A1 | 3/2006 | Maeda et al. |
| 2006/0060834 A1 | 3/2006 | Hirai |
| 2006/0061270 A1 | 3/2006 | Uhlig et al. |
| 2006/0066224 A1 | 3/2006 | Ito |
| 2006/0068519 A1 | 3/2006 | Dunbar et al. |
| 2006/0071334 A1 | 4/2006 | Kawabata et al. |
| 2006/0075584 A1 | 4/2006 | Ishikawa et al. |
| 2006/0076553 A1 | 4/2006 | Lee et al. |
| 2006/0076554 A1 | 4/2006 | Maeda et al. |
| 2006/0076556 A1 | 4/2006 | Hobara et al. |
| 2006/0079038 A1 | 4/2006 | Hu et al. |
| 2006/0081840 A1 | 4/2006 | Mori et al. |
| 2006/0081880 A1 | 4/2006 | Miyazaki et al. |
| 2006/0092225 A1 | 5/2006 | Nakamura et al. |
| 2006/0092343 A1 | 5/2006 | Nilsson |
| 2006/0093937 A1 | 5/2006 | Grinwald |
| 2006/0094153 A1 | 5/2006 | Furukawa |
| 2006/0094172 A1 | 5/2006 | Lee et al. |
| 2006/0097360 A1 | 5/2006 | Wu et al. |
| 2006/0098485 A1 | 5/2006 | Leenders et al. |
| 2006/0099526 A1 | 5/2006 | Yang |
| 2006/0099732 A1 | 5/2006 | Miura et al. |
| 2006/0102893 A1 | 5/2006 | Gerlach et al. |
| 2006/0102894 A1 | 5/2006 | Masuda et al. |
| 2006/0102896 A1 | 5/2006 | Suh et al. |
| 2006/0102919 A1 | 5/2006 | Watanabe et al. |
| 2006/0102966 A1 | 5/2006 | Leenders et al. |
| 2006/0105492 A1 | 5/2006 | Veres et al. |
| 2006/0108916 A1 | 5/2006 | Koo et al. |
| 2006/0113523 A1 | 6/2006 | Kubota et al. |
| 2006/0113894 A1 | 6/2006 | Fujii et al. |
| 2006/0115983 A1 | 6/2006 | Fujii et al. |
| 2006/0116000 A1 | 6/2006 | Yamamoto |
| 2006/0118047 A1 | 6/2006 | Papadimitrakopoulos et al. |
| 2006/0118699 A1 | 6/2006 | Osame et al. |
| 2006/0121308 A1 | 6/2006 | Katoh et al. |
| 2006/0121670 A1 | 6/2006 | Stasiak |
| 2006/0121745 A1 | 6/2006 | Fujii |
| 2006/0124921 A1 | 6/2006 | Ong et al. |
| 2006/0124923 A1 | 6/2006 | Wu et al. |
| 2006/0124925 A1 | 6/2006 | Kondo et al. |
| 2006/0125009 A1 | 6/2006 | Wu et al. |
| 2006/0127592 A1 | 6/2006 | Spreitzer et al. |
| 2006/0128969 A1 | 6/2006 | Li et al. |
| 2006/0131561 A1 | 6/2006 | Hirai et al. |
| 2006/0131564 A1 | 6/2006 | Shukla et al. |
| 2006/0131565 A1 | 6/2006 | Lewis et al. |
| 2006/0131567 A1 | 6/2006 | Liu et al. |
| 2006/0131570 A1 | 6/2006 | Meng |
| 2006/0131573 A1 | 6/2006 | Arai et al. |
| 2006/0132029 A1 | 6/2006 | Sato |
| 2006/0132461 A1 | 6/2006 | Furukawa et al. |
| 2006/0132666 A1 | 6/2006 | Niiya et al. |
| 2006/0134823 A1 | 6/2006 | Shukla et al. |
| 2006/0134824 A1 | 6/2006 | Bao et al. |
| 2006/0138402 A1 | 6/2006 | Cao et al. |
| 2006/0138404 A1 | 6/2006 | Okada et al. |
| 2006/0138405 A1 | 6/2006 | Yang et al. |
| 2006/0138406 A1 | 6/2006 | Bao et al. |
| 2006/0138423 A1 | 6/2006 | Hirai |
| 2006/0138946 A1 | 6/2006 | Wang et al. |
| 2006/0138947 A1 | 6/2006 | MacPherson |
| 2006/0139342 A1 | 6/2006 | Yu |
| 2006/0139733 A1 | 6/2006 | Lee et al. |
| 2006/0141664 A1 | 6/2006 | Bao et al. |
| 2006/0144276 A1 | 7/2006 | MacPherson et al. |
| 2006/0145141 A1 | 7/2006 | Miura et al. |

| | | |
|---|---|---|
| 2006/0145145 A1 | 7/2006 | Nishio |
| 2006/0145148 A1 | 7/2006 | Hirai et al. |
| 2006/0145596 A1 | 7/2006 | Coe |
| 2006/0148167 A1 | 7/2006 | Brown et al. |
| 2006/0151781 A1 | 7/2006 | Kim et al. |
| 2006/0151820 A1 | 7/2006 | Duan et al. |
| 2006/0155040 A1 | 7/2006 | Veres et al. |
| 2006/0157692 A1 | 7/2006 | Wada et al. |
| 2006/0157772 A1 | 7/2006 | Sumida et al. |
| 2006/0158106 A1 | 7/2006 | Morii |
| 2006/0159841 A1 | 7/2006 | Endo et al. |
| 2006/0159849 A1 | 7/2006 | Morita et al. |
| 2006/0159899 A1 | 7/2006 | Edwards et al. |
| 2006/0160276 A1 | 7/2006 | Brown et al. |
| 2006/0160280 A1 | 7/2006 | Suh et al. |
| 2006/0162650 A1 | 7/2006 | Kido et al. |
| 2006/0163744 A1 | 7/2006 | Vanheusden et al. |
| 2006/0164359 A1 | 7/2006 | Kimura |
| 2006/0166411 A1 | 7/2006 | Morisue et al. |
| 2006/0169973 A1 | 8/2006 | Isa et al. |
| 2006/0170111 A1 | 8/2006 | Isa et al. |
| 2006/0171187 A1 | 8/2006 | Beigel et al. |
| 2006/0172448 A1 | 8/2006 | Carter et al. |
| 2006/0181490 A1 | 8/2006 | Ozaki |
| 2006/0186410 A1 | 8/2006 | Ahn et al. |
| 2006/0191440 A1 | 8/2006 | Ishikawa et al. |
| 2006/0194444 A1 | 8/2006 | Li et al. |
| 2006/0196375 A1 | 9/2006 | Coe-Sullivan et al. |
| 2006/0197079 A1 | 9/2006 | Suh et al. |
| 2006/0197884 A1 | 9/2006 | Kim et al. |
| 2006/0202191 A1 | 9/2006 | Gerlach et al. |
| 2006/0202288 A1 | 9/2006 | Yamamoto et al. |
| 2006/0203533 A1 | 9/2006 | Kato et al. |
| 2006/0205172 A1 | 9/2006 | Gerlach et al. |
| 2006/0208962 A1 | 9/2006 | Sekiya |
| 2006/0210704 A1 | 9/2006 | Kimura et al. |
| 2006/0211180 A1 | 9/2006 | Nakayama et al. |
| 2006/0211183 A1 | 9/2006 | Duan et al. |
| 2006/0214154 A1 | 9/2006 | Yang et al. |
| 2006/0214155 A1 | 9/2006 | Ong et al. |
| 2006/0214159 A1 | 9/2006 | Nakayama et al. |
| 2006/0214160 A1 | 9/2006 | Furukawa et al. |
| 2006/0214162 A1 | 9/2006 | Kawai et al. |
| 2006/0214192 A1 | 9/2006 | Nanai et al. |
| 2006/0214252 A1 | 9/2006 | Hirai et al. |
| 2006/0214312 A1 | 9/2006 | Wu et al. |
| 2006/0214571 A1 | 9/2006 | Yamamoto et al. |
| 2006/0214987 A1 | 9/2006 | Nakamura |
| 2006/0216851 A1 | 9/2006 | Russell et al. |
| 2006/0216853 A1 | 9/2006 | Nomoto |
| 2006/0216872 A1 | 9/2006 | Arai et al. |
| 2006/0220007 A1 | 10/2006 | Bailey et al. |
| 2006/0220009 A1 | 10/2006 | Wu et al. |
| 2006/0220022 A1 | 10/2006 | Moriya |
| 2006/0220537 A1 | 10/2006 | Takeshita et al. |
| 2006/0220541 A1 | 10/2006 | Koyama |
| 2006/0223219 A1 | 10/2006 | Newsome et al. |
| 2006/0226420 A1 | 10/2006 | Nanai et al. |
| 2006/0228533 A1 | 10/2006 | Nakagawa |
| 2006/0231527 A1 | 10/2006 | Takayama et al. |
| 2006/0231829 A1 | 10/2006 | Wu et al. |
| 2006/0231908 A1 | 10/2006 | Liu et al. |
| 2006/0232600 A1 | 10/2006 | Kimura et al. |
| 2006/0232601 A1 | 10/2006 | Kimura et al. |
| 2006/0234335 A1 | 10/2006 | Nakamura |
| 2006/0234430 A1 | 10/2006 | Liu et al. |
| 2006/0234505 A1 | 10/2006 | Asano et al. |
| 2006/0234519 A1 | 10/2006 | Pan et al. |
| 2006/0237537 A1 | 10/2006 | Empedocles et al. |
| 2006/0237712 A1 | 10/2006 | Shukla et al. |
| 2006/0237717 A1 | 10/2006 | Bai et al. |
| 2006/0238135 A1 | 10/2006 | Kimura |
| 2006/0240603 A1 | 10/2006 | Mathea et al. |
| 2006/0240605 A1 | 10/2006 | Moon et al. |
| 2006/0244369 A1 | 11/2006 | Eiichi |
| 2006/0244391 A1 | 11/2006 | Shishido et al. |
| 2006/0244689 A1 | 11/2006 | Osame et al. |
| 2006/0244699 A1 | 11/2006 | Yamazaki |
| 2006/0251886 A1 | 11/2006 | Muller et al. |
| 2006/0254440 A1 | 11/2006 | Choi et al. |
| 2006/0255335 A1 | 11/2006 | Nishikawa et al. |
| 2006/0255722 A1 | 11/2006 | Imanishi |
| 2006/0261334 A1 | 11/2006 | Ando et al. |
| 2006/0262266 A1 | 11/2006 | Vogels et al. |
| 2006/0263953 A1 | 11/2006 | Bonfiglio |
| 2006/0267002 A1 | 11/2006 | Fischer et al. |
| 2006/0267004 A1 | 11/2006 | Fallis et al. |
| 2006/0267005 A1 | 11/2006 | Kawase et al. |
| 2006/0267006 A1 | 11/2006 | Ando et al. |
| 2006/0267138 A1 | 11/2006 | Kobayashi |
| 2006/0267202 A1 | 11/2006 | Matsuzaki |
| 2006/0267889 A1 | 11/2006 | Kimura |
| 2006/0269876 A1 | 11/2006 | Ishikawa et al. |
| 2006/0270066 A1 | 11/2006 | Imahayashi et al. |
| 2006/0273311 A1 | 12/2006 | Ohe et al. |
| 2006/0273312 A1 | 12/2006 | Miyata et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2006/0281332 A1 | 12/2006 | Duinveld et al. |
| 2006/0284171 A1 | 12/2006 | Levy et al. |
| 2006/0284230 A1 | 12/2006 | Yang et al. |
| 2006/0284556 A1 | 12/2006 | Tremel et al. |
| 2006/0286737 A1 | 12/2006 | Levy et al. |
| 2006/0289859 A1 | 12/2006 | Yoneya |
| 2006/0292777 A1 | 12/2006 | Dunbar |
| 2007/0001167 A1 | 1/2007 | Nomura |
| 2007/0001205 A1 | 1/2007 | Kimura |
| 2007/0001224 A1 | 1/2007 | Yamaguchi et al. |
| 2007/0001581 A1 | 1/2007 | Stasiak et al. |
| 2007/0001595 A1 | 1/2007 | Nakagawa |
| 2007/0002084 A1 | 1/2007 | Kimura et al. |
| 2007/0004202 A1 | 1/2007 | Fujii |
| 2007/0004229 A1 | 1/2007 | Malajovich |
| 2007/0007515 A1 | 1/2007 | Suh et al. |
| 2007/0012980 A1 | 1/2007 | Duan et al. |
| 2007/0013613 A1 | 1/2007 | Umezaki |
| 2007/0014916 A1 | 1/2007 | Daniels |
| 2007/0018151 A1 | 1/2007 | Sirringhaus et al. |
| 2007/0020395 A1 | 1/2007 | Lang et al. |
| 2007/0023748 A1 | 2/2007 | Vogel et al. |
| 2007/0023837 A1 | 2/2007 | Lee et al. |
| 2007/0026580 A1 | 2/2007 | Fujii |
| 2008/0150187 A1 * | 6/2008 | Daniel et al. .................. 264/132 |

\* cited by examiner

SYSTEMS AND METHODS FOR THE MANUFACTURE OF FLAT PANEL DEVICES

RELATED APPLICATIONS

The present application claims benefit or priority from U.S. Provisional Patent Application 60/765,360, filed Feb. 6, 2006, which is expressly incorporated herein by reference.

FIELD OF THE INVENTION

The present invention relates to the field of hybrid manufacturing process for producing thick, high resolution electrically conductive structures, and more particularly to systems and methods for the production back planes for flat panel displays and the displays produced thereby.

BACKGROUND TO THE INVENTION

Current flat panel display technologies include, but are not limited to: Active Matrix Liquid Crystal Displays (AMLCD); Organic Light Emitting Diodes (OLED); Electrochromic (Electrical addressed color changing chemistry); and Electrophoretic (Inexpensive, mono chrome, bi-stable technologies [E ink, Gyricon]).

All of these technologies employ a back plane of electrically conductive (e.g., metallic, InSnO/ITO) traces and pixel electrodes, each electrode is "driven" by one or more transistors, hence the name "active matrix" with respect to the liquid crystal implementation. The manufacture of these back planes is now quite complex, and therefore costly. Typically, manufacture of the back plane requires five or six material deposition steps, each of which begins with a broad area deposited (sprayed or sputtered) conductive material, which is then photo-lithographically defined into separate conductive structure, for example by the sub-process steps of:

a) First sputter material
b) Coat with photo polymer resist
c) Selectively expose through photo tool
d) Develop away unexposed photo polymer resist
e) Etch material
f) Strip etch resist This is a total of six sub-process steps for each of five or six materials equaling 30 to 36 individual steps.

The resulting active matrix back planes have a manufacturing cost of about $50 US per square foot (as of late 2005).

Known organic semiconducting materials include pentacene (see, US 20040232411, expressly incorporated herein by reference), polythiophene, polyfluoren, poly(3-alkylthiophene), a polythiophene derivative (see, US 20070026580, expressly incorporated herein by reference), semiconducting single walled carbon nanotubes (SWCNT) (see, US 20060071334, expressly incorporated herein by reference), and the like. Ink jet printing of such materials to form active devices is known. (See, US 20070023837, 20070023748, 20070020395, 20070018151, 20070014916, 20070013613, 20070012980, 20070007515, 20070004229, 20070004202, 20070002084, 20070001595, 20070001581, 20070001224, 20070001205, 20070001167, 20060292777, 20060289859, 20060286737, 20060284556, 20060284230, 20060284171, 20060281332, 20060279491, 20060273996, 20060273995, 20060273312, 20060273311, 20060270066, 20060269876, 20060267889, 20060267202, 20060267138, 20060267006, 20060267005, 20060267004, 20060267002, 20060263953, 20060262266, 20060261334, 20060255722, 20060255335, 20060254440, 20060251886, 20060244699, 20060244689, 20060244391, 20060244369, 20060240605, 20060240603, 20060238135, 20060237717, 20060237712, 20060237537, 20060234519, 20060234505, 20060234430, 20060234335, 20060232601, 20060232600, 20060231908, 20060231829, 20060231527, 20060228533, 20060226420, 20060223219, 20060220541, 20060220537, 20060220022, 20060220009, 20060220007, 20060216872, 20060216853, 20060216851, 20060214987, 20060214571, 20060214312, 20060214252, 20060214192, 20060214162, 20060214160, 20060214159, 20060214155, 20060214154, 20060211183, 20060211180, 20060210704, 20060208962, 20060205172, 20060203533, 20060202288, 20060202191, 20060197884, 20060197079, 20060196375, 20060194444, 20060191440, 20060186410, 20060181490, 20060172448, 20060171187, 20060170111, 20060169973, 20060166411, 20060164359, 20060163744, 20060162650, 20060160280, 20060160276, 20060159899, 20060159849, 20060159841, 20060158106, 20060157772, 20060157692, 20060155040, 20060151820, 20060151781, 20060148167, 20060145596, 20060145148, 20060145145, 20060145141, 20060144276, 20060141664, 20060139733, 20060139342, 20060138947, 20060138946, 20060138423, 20060138406, 20060138405, 20060138404, 20060138402, 20060134824, 20060134823, 20060132666, 20060132461, 20060132029, 20060131573, 20060131570, 20060131567, 20060131565, 20060131564, 20060131561, 20060128969, 20060127592, 20060125009, 20060124925, 20060124923, 20060124921, 20060121745, 20060121670, 20060121308, 20060118699, 20060118047, 20060116000, 20060115983, 20060113894, 20060113523, 20060108916, 20060105492, 20060102966, 20060102919, 20060102896, 20060102894, 20060102893, 20060099732, 20060099526, 20060098485, 20060097360, 20060094172, 20060094153, 20060093937, 20060092343, 20060092225, 20060081880, 20060081840, 20060079038, 20060076556, 20060076554, 20060076553, 20060075584, 20060068519, 20060066224, 20060061270, 20060060834, 20060054884, 20060054883, 20060049398, 20060049395, 20060045959, 20060044299, 20060044229, 20060043432, 20060043359, 20060043346, 20060040435, 20060040135, 20060038804, 20060038174, 20060036065, 20060033428, 20060033105, 20060033086, 20060030067, 20060027860, 20060027838, 20060027806, 20060027800, 20060024860, 20060017659, 20060014365, 20060013549, 20060012296, 20060012294, 20060012290, 20060012289, 20060011909, 20060011889, 20060009614, 20060008956, 20060007520, 20060006381, 20060006380, 20060006378, 20060001726, 20050285830, 20050285114, 20050285101, 20050285099, 20050282068, 20050280359, 20050280002, 20050277776, 20050277760, 20050277234, 20050276981, 20050276115, 20050275056, 20050274954, 20050274946, 20050274945, 20050269568, 20050269562, 20050266687, 20050263765, 20050260452, 20050260439, 20050259121, 20050259053, 20050258771, 20050258422, 20050258417, 20050255616, 20050250244, 20050249970, 20050247978, 20050247928, 20050245078, 20050244995, 20050243079, 20050242713, 20050242345, 20050236614, 20050233491, 20050231564, 20050231555, 20050230752, 20050230678, 20050221203, 20050218819, 20050218791, 20050218450, 20050215067, 20050214688, 20050211975, 20050208332, 20050205861, 20050202348, 20050197030, 20050196711, 20050196710, 20050194894, 20050194588, 20050189876, 20050189537, 20050186403, 20050184659, 20050181533, 20050179036, 20050173701, 20050170621, 20050170550, 20050170202, 20050170076, 20050168415, 20050164019, 20050163938, 20050163932, 20050162366, 20050162354, and 20050161664, each of which is expressly incorporated herein by reference.)

SUMMARY OF THE INVENTION

The present invention provides a hybrid manufacturing process in which the basic metal layers are printed in a massively parallel manner using electrographic toner technology, and then the active elements (i.e. the transistors) are printed either by ink jet techniques (in a first embodiment) or by electrographic techniques (in a second embodiment) for providing some of the active element parts (the semi-conducting material and/or the gate electrode). In an alternate embodiment, a technique is used to produce very thick metal layers, especially important for large, flat panel display structures. While the present invention describes the manufacture of MOS-FET transistors by means of printing techniques, there are many other types of transistors which have been demonstrated and produced commercially over the years, and the present invention may be able to implement these other types as well. Thus, it is understood that any known type of semiconductor or electronic modulator structure compatible with the present systems and methods may be fabricated, and the invention is not limited by the preferred embodiments thereof.

It is therefore an object of the present invention to provide a method for the manufacture of an active matrix backplane, comprising the steps of electrographically forming a first metal layer comprising a set of conductive portions on an insulating substrate; forming a cross-over dielectric by a process selected from an electrographic process and a raster deposition process; forming a second metal layer by a process selected from an electrographic process and a raster deposition process; and forming a semiconducting material portion, a gate dielectric, and a gate electrode by a raster deposition process. The cross-over dielectric and the second metal layer may be formed electographically or by a raster deposition process. The gate dielectric and cross-over dielectric are preferably formed concurrently by a raster deposition process. The raster deposition processes may comprise an ink jet printing process. The gate electrode and second metal layer may be formed concurrently by a raster deposition process. Likewise, the cross-over dielectric and the gate dielectric layer may be formed concurrently by an first ink jet printing step, and the gate electrode and the second metal layer may be formed concurrently by a second ink jet printing step. The gate dielectric preferably comprises an organic semiconductor material deposited by an ink jet printing process, but may also be an anisotropic carbon nanotube matrix material, e.g., semiconducting single wall carbon nanotubes.

It is a further object according to the present invention to provide products formed by the foregoing methods, including various combinations and permutations of the optional steps.

It is a still further object of the invention to provide a backplane having a circuit array having at least one region comprising a substrate having a conductive plane under a dielectric surface, a first conductive layer on said dielectric surface, a selectively disposed insulator disposed over said first conductive layer, and a second conductive layer disposed on said insulator, wherein said first conductive layer is electrically insulated from said second conductive layer, wherein the first conductive layer is formed electrographically, and the second conductive layer is formed by a process comprising selective deposition of liquid droplets, which are then solidified. The dielectric surface may comprises a photopolymer which selectively retains charge in regions which have been exposed to light, the first conductive layer being formed in a pattern corresponding to a light exposure of said photopolymer. The second conductive layer and the selectively disposed insulator preferably function as the gate and channel, respectively, of a field effect transistor device. The second conductive layer may also cross the first conductive layer, separated by the selectively disposed insulating layer, substantially without electrical interaction. The liquid droplets may be deposited by an ink jet printer head. The selectively disposed insulating layer preferably comprises one or more material selected from the group consisting of a pentacene, a polythiophene, an epoxy, and a carbon nanotube matrix. The first and/or second conductive layers may be formed from a material comprising a metal organic decomposition product.

Preferably, the backplane further comprises an electro-optic modulator, responsive to electrical signals within at least one of said first conductive layer and said second conductive layer, to form a display panel.

The backplane may also comprise an antenna array.

DETAILED DESCRIPTION OF THE PREFERRED EMBODIMENTS

Electrographic Steps of the Preferred Embodiment

Figure 1:
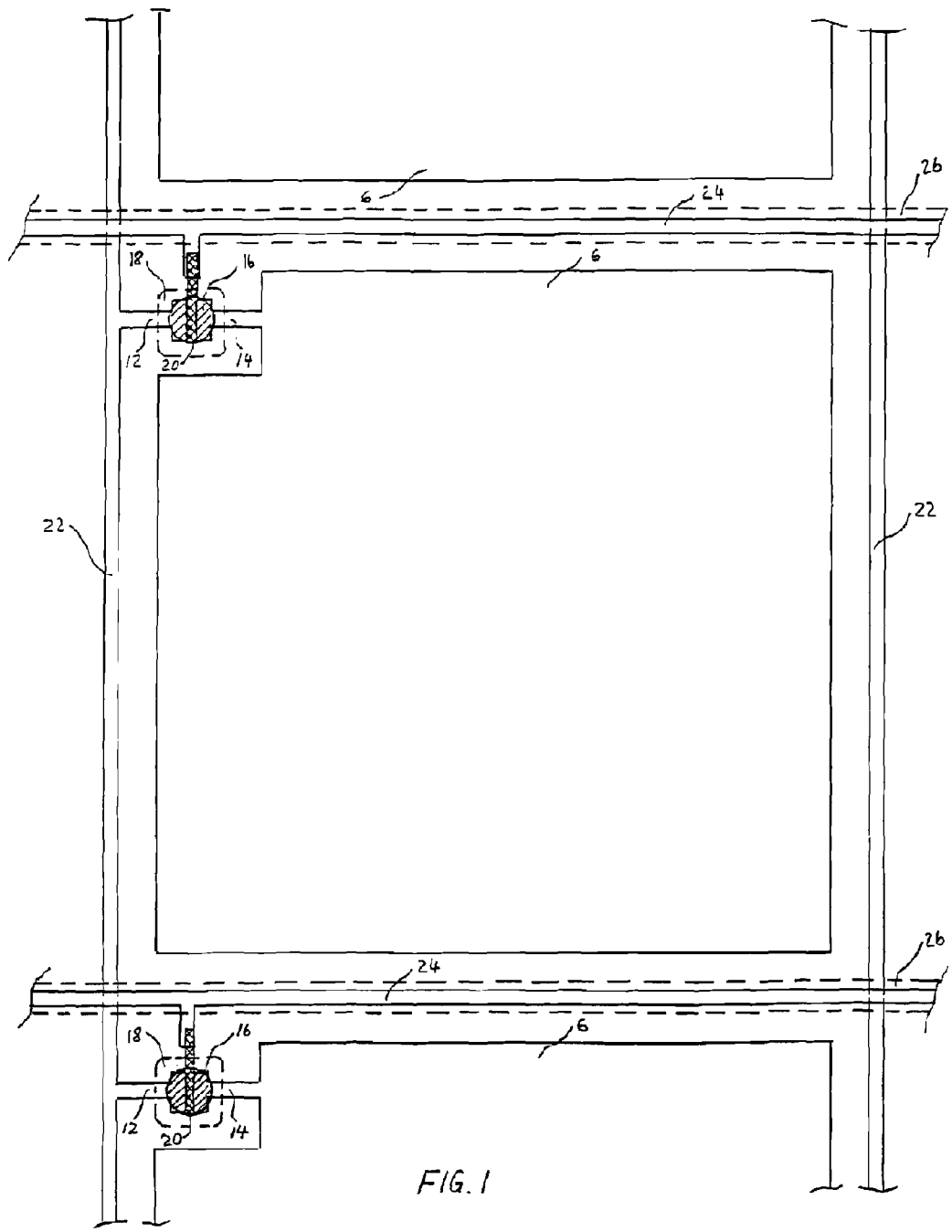
FIG. 1 show a plan view of one pixel of the display of a back plane made with three electrographic printing steps and three ink jet printing steps.

An active matrix flat panel is shown in FIG. 1. In this device, a first metal layer consists of column bus 22 with source electrode 12 and drain electrode 14 connected to pixel electrode 6, printed by the method described below with respect to FIGS. 4A, 4B and 4C, etc. A cross-over dielectric 26 is printed in by means of electrostatic transfer from a trenched printing plate (described in FIGS. 5 and 6).

A second metal layer 24, comprising the row bus (or gate bus) is printed in a similar manner as the cross over dielectric. Semi conducting material 16 is next ink jetted in place, then gate dielectric 18 and finally the gate electrode 20; for a total of 3 ink jet steps to finish the back plane.

The manufacturing steps of the preferred embodiment are as follows:

1.) On a conductive (e.g., metallized) carrier substrate, place by, e.g., lamination or liquid coating, a photopolymer dielectric layer, which forms an electrostatic print plate material as described in Detig et al. U.S. Pat. No. 6,781,612, expressly incorporated herein by reference;

2.) Expose this with a pattern of light corresponding to the retained pattern or photopolymer desired on the substrate, for example by laser scanning or in image-wise fashion through a photo exposure tool;

3.) Sensitize this plate by corona charging it, for instance, and develop with a metal particle toner as in Kydd et al., U.S. Pat. No. 6,036,889, expressly incorporated herein by reference;

4.) Fix this toner in place by a process to consolidate the particles, for example heat, microwaves, etc. Steps 1 through 4 form the first metal layer.

5.) Then a dielectric (resin type) toner is imaged in a trenched printing plate (See Eberlein et al., U.S. Pat. No. 6,815,130, expressly incorporated herein by reference, and FIG. 6 hereof)

Figure 7:
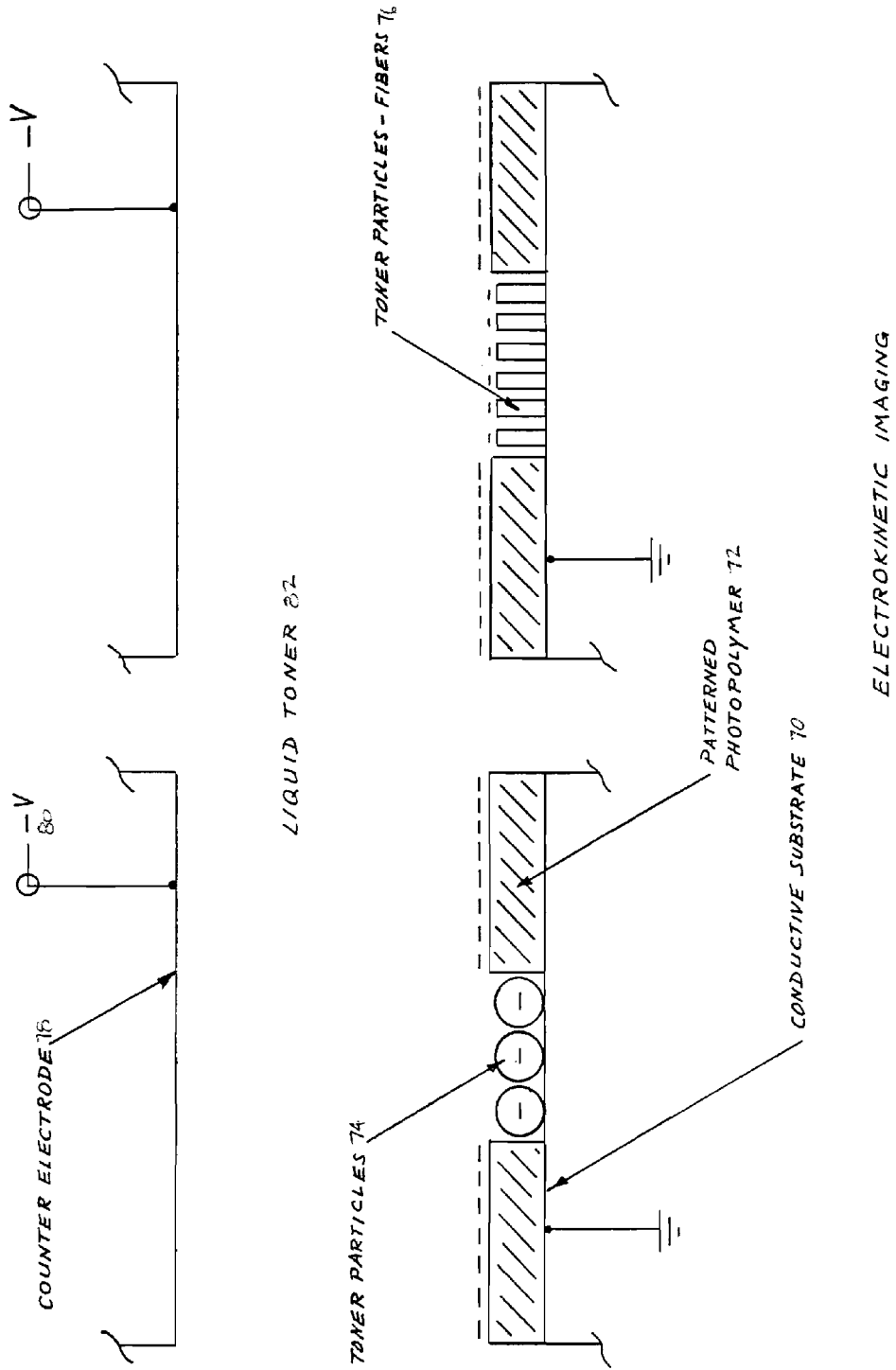
FIG. 7 shows the transfer of any toner from a trenched printing plate to the back plane.

6.) This dielectric toner is then transferred to the backplane under construction having previously deposited conductive traces (steps 1 through 4) as shown in FIG. 7;

7.) Processing this resin toner, e.g., by heat reflow, to form a pin-hole free, image film;

8.) Another layer of metal toner (similar to step 3, supra) is imaged in a second trench printing step (similar to step 5, but with a conductive toner and a different trench pattern) and transferred to the back plane as in step 6; and 9.) This second metal layer is now processed, e.g., with heat to a sintering temperature to form a solid metal, to form a conductive trace.

The back plane is now completed by three steps:

a.) The semiconductive material is deposited, e.g., by a raster deposition process, such as by an ink jet printing process, and then dried, cured, etc.

b.) The gate dielectric is deposited, e.g., by a raster deposition process, such as by an ink jet printing process over the semiconductive material and processed as necessary, for example by drying and reflowing; and c.) The gate electrodes are formed, e.g., by a raster deposition process, such as by an ink jet printing process, at their proper locations, see gate electrode 20 in FIGS. 1 and 3.

In accordance with this process, in three electrographic printing steps and three ink jet steps, the entire back plane is complete. This replaces the 30 to 36 steps required with current technologies.

The following gives a more detailed description of a preferred embodiment of the basic first metal printing step and the second and third electrographic printing steps, wherein the toner is transferred to the back plane in process, from a trenched printing plate.

Figure 4A:
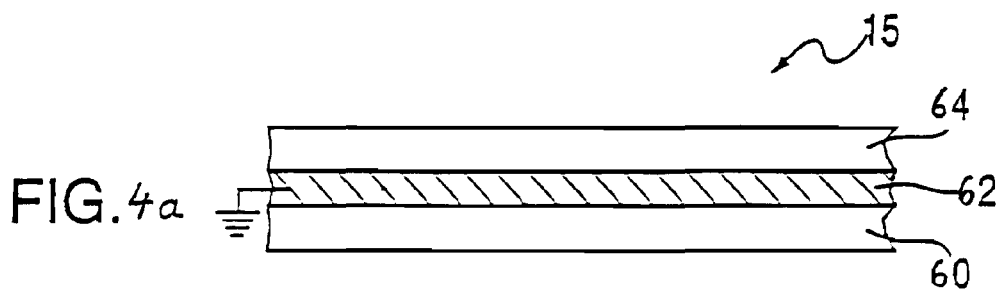
FIGS. 4A, 4B, 4C and 4D show the basic steps in producing metal traces directly on a high resolution printing plate material.
Figure 4B:
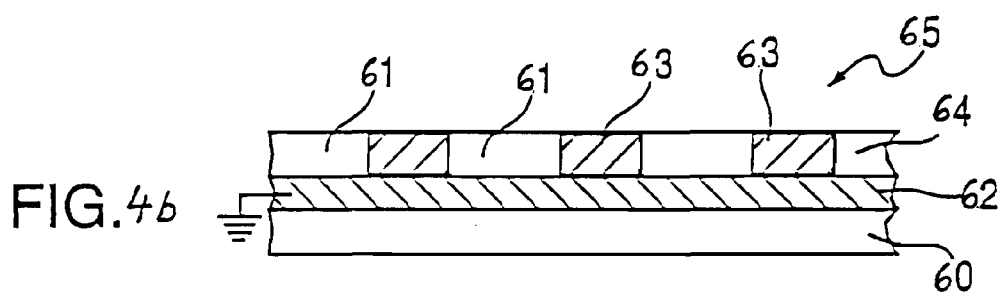

FIG. 4A shows a substrate 60, which may be formed of any material providing sufficient mechanical support. In an AMLCD embodiment, the preferred substrate is a transparent glass, though in other display technologies, an optically transparent substrate is not required. A conductive layer 62 is formed to establish an electrical ground plane on the substrate 60. This conductive layer 62 could be a thin metal foil, a thinner layer of sputtered or evaporated metal or ITO, sputtered to a few microns thick or evaporated to 500 Angstrom units thick. The conductive layer 62 is coated with a photo polymer layer 64 by either lamination, spray, roller or spin coating. FIG. 4B shows the photo polymer layer 61, after exposure to actinic radiation through a photo-tool (not shown). Regions 63 have been cross linked by the actinic radiation. The photo-exposed regions of the photopolymer 63 will hold a charge over time, while the unexposed regions 61 will leak charge over time, and become discharged within a few seconds.

Figure 4C:
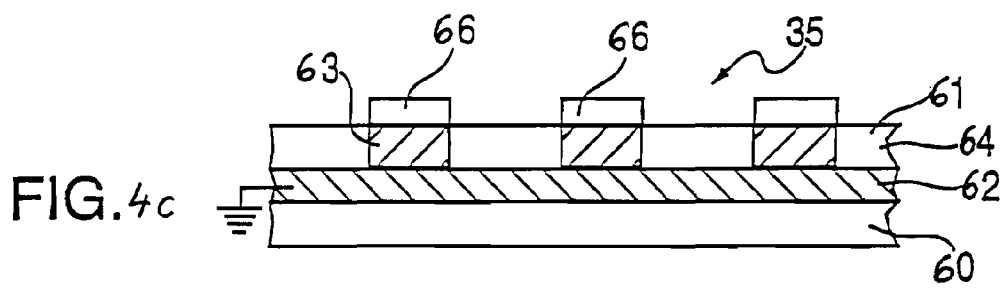
Figure 4D:
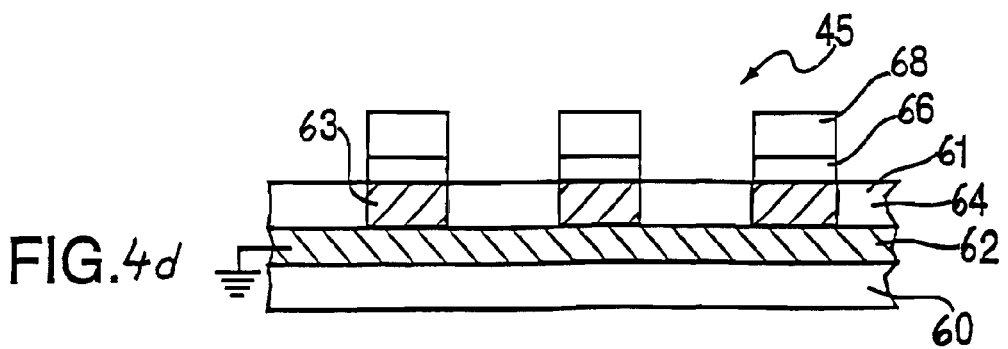

Photopolymer layer 64 is then sensitized by charging with a corona discharge device, by means not shown in FIGS. 4A-4D. Those cross linked regions 63 that hold charge are selectively developed by a conductive toner material 66. The developed toner material 66, which, for example, contains a high concentration of particles which, when further processed, form a conductive metal film. These particles may then be processed, for example by heat, by means not shown in FIGS. 4A-4D, which is, for example, an oven or heater, resulting in highly conductive metal trace, as shown in FIG. 4C. Optionally, if more metal thickness is needed, an electroplating or electro-less plating step can be incorporated in the process, resulting in a structure as shown in FIG. 4D. In particular, the plated metal 68 may be, for example, copper, while the toner material 66 may be, for example, an organometallic-coated silver particle toner which, when heated to about 150 C, decomposes to yield a silver film.

The first metal layer of the backplane is complete. Note that the photopolymer layer 64 stays with the final product, and acts as a dielectric layer if the substrate is metal or metal foil.

As shown in FIG. 1, the following structures are formed from this first phase of the process: the column driver 22, the pixel electrode 6, the source electrode 12, drain electrode 14, for the transistor to be printed.

Figure 5:
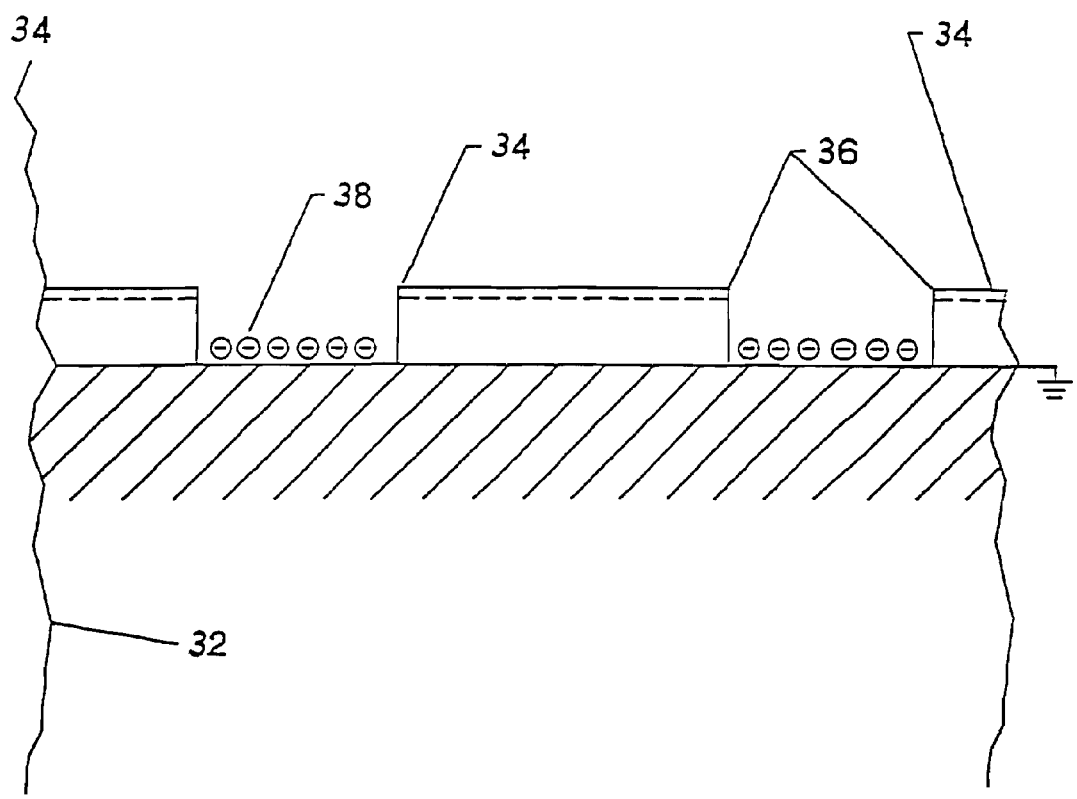
FIG. 5 shows the basic method for imaging any toner on a trenched electrostatic printing plate.

The cross over dielectric layer 26, shown in FIG. 1, is produced using a trenched electrostatic printing plate, 34 in FIG. 5. Dielectric toner 38 is developed in the trenches because of charges 36 (negative) on cross linked photopolymer 34. The negatively charged particles 38 do not deposit on the negatively charged cross linked photopolymer 34, and thus are present only in the trenches adjacent to the conductive substrate 32. In this case, the conductive substrate 32 may be directly exposed to the dielectric toner. It is noted that the photopolymer in this case is itself developed to remove the non-cross linked regions.

Figure 6:
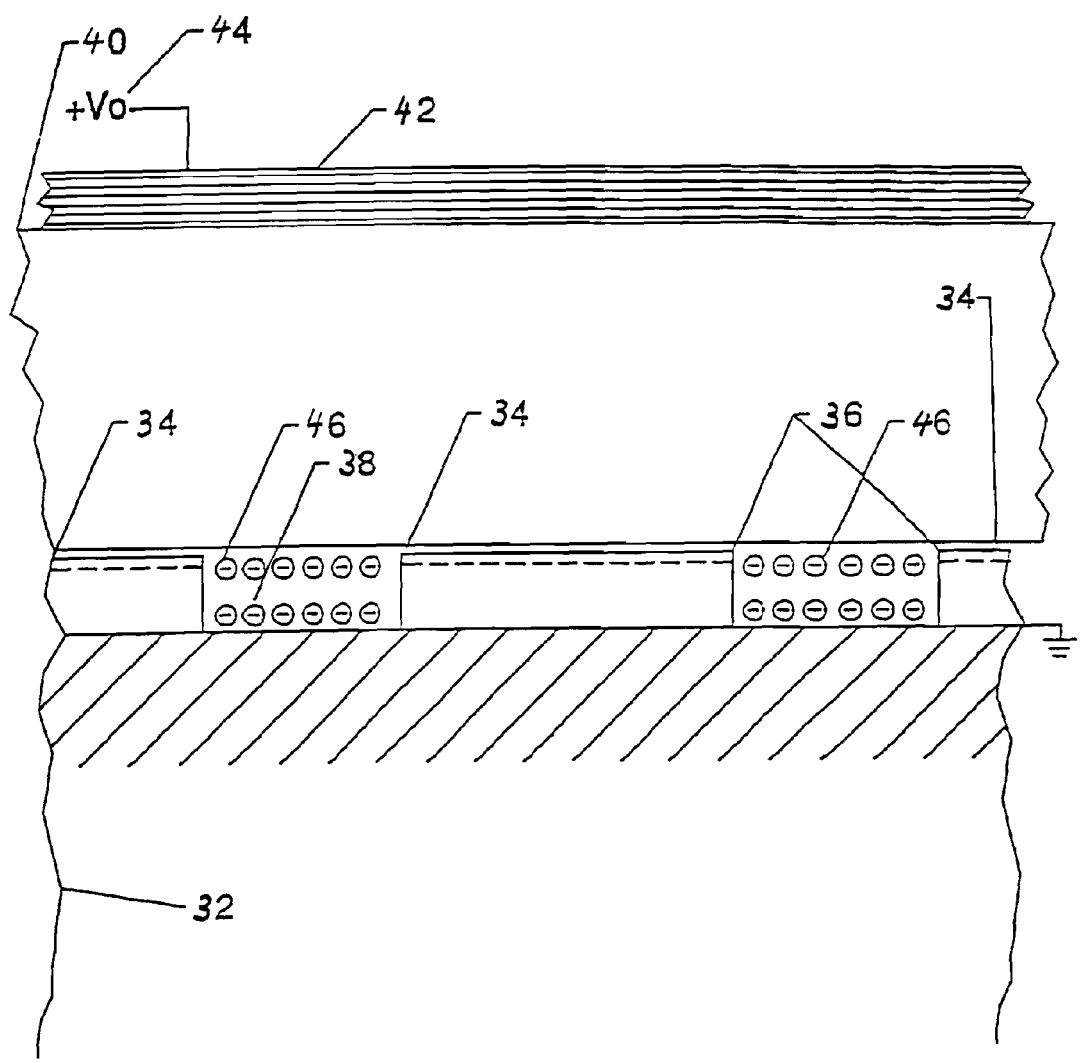
FIG. 6 shows the basic method for imaging any toner in a trenched electrostatic printing plate.

The dielectric toner image, 38 of FIG. 5, is transferred by means of electrostatic forces to an proximate backplane 40 in progress, as shown in FIG. 6. Electrode 42 has a suitable voltage 44 to transfer toner 38 from the trenches, to become toner 46 on the backplane 40. Note an appropriate transfer voltage could be zero volts or a small voltage, while a large negative $V_o$ (44 of FIG. 6) will prevent transfer until a suitable instant. The transferred toner 46 on the backplane 40 is now fixed in place by heat, typically after the trenched plate 34 is removed.

The second metal layer, for example the row electrodes 24, are deposited using a trenched plate similar to that shown in FIG. 5, having a desired trench pattern. In this case, since the toner is a conductive toner, the conductive substrate is dielectrically isolated from the particles, so that they retain their charge during the process and avoid induction charging. This may be accomplished by providing a thin dielectric layer on the electrostatic printing plate 32 (not shown), or providing a sacrificial dielectric layer on the conductive particles themselves. In addition, the charge on the electrostatic printing plate is of the same polarity as the electrochemical charge on the conductive toner particles. The transfer of the conductive toner formed in the trench of the printing plate 32 to the backplane 40 is accomplished by initially bringing the backplane 40 proximate to the electrostatic printing plate 32 with each charged to the same potential, and then dropping the potential on the backplane 40 to 0, which transfers the particles.

The toner is a good conducting toner versus the dielectric toner. Note the toners of the first and second metal layers could be substantially identical. After final processing the second metal layer, the electrographic portion of the back plane 40 is complete.

The substrate for the electrostatic printing plate 32 is, for example, anodized aluminum 50 to 200 µ thick. The anodizing provides sufficient dielectric strength to permit use with conductive toners, while also permitting use with dielectric toners.

The substrate 60, shown in FIGS. 4A-4D, may be polyester (polyethylene terphthalate) film, e.g., Mylar®, and the conductive coating 62 may be, for example, evaporated aluminum, or sputtered indium-tin-oxide, to provide optical transparency.

The photopolymer 64 is, for example, Shippley Dynamask 5020 or 5030 (Shippley, Marlborough, Mass.).

The conductive toner is, for example, an organometalic coated silver particle toner, e.g., Kydd et al. U.S. Pat. No. 6,036,889.

The dielectric toner is, for example, HP/Indigo EPrint 1000 toner, HP Palo Alto, Calif.

The photopolymer 34 for the trenched electrostatic plate 32 is, for example, Shippley Dynamask 5030 or 5040.

Ink Jet Printing Step of the Preferred Embodiment

Various organic semiconducting materials are available for forming active semiconductors are:
  a.) Ink jet print pentacene pre-cursors by Phillips, etc.
  b.) Printable polythiophenes by Merch/Avesia Inc. and Plastic Logic Inc.

Each of these is adaptable for ink jet printing processes to form pinhole-free thin and uniform layers, of the order of 100 nanometers or less in thickness. In a similar manner the gate dielectric generally needs to be thinner than about 100 nm for some low gate voltage applications. Again, such gate dielectric materials are also adaptable for ink jet printing. Finally the gate electrode needs only to be accurately "overlaid" between the source drain electrodes for maximum frequency response. For low speed application (PC monitors versus "action" video) large, gross overlapping of the source/drain may be acceptable. The gate electrode need not be very conductive, since it handles only "capacitive" charges and gate "leakage" currents (voltage/resistance) are very small. They are probably in the nano ampere to pico ampere range (in single crystal silicon they can be in the femto ampere ($10^{-15}$) range. The gate electrodes are interconnected simultaneously with the gate buses in this ink jet printing operation.

The organic semiconductor material 16 which forms the transistor body is, for example, Merck Lisicon SP-201 (EMD Chemical/div Merck KGa, Darmstadt, Germany). The gate dielectric material 18 is, for example, Lisicon D (EMD). The gate electrode 20 is, for example, an ink jet printable conductive film material from Cabot/Superior Micropowders, Alberquerque N. Mex.

The backplane 40 of the flat panel is now finished.

Therefore, in accordance with a preferred embodiment of the present invention, in six printing steps, three electrographic and three ink jet; the back plane 40 is completed. This compares with the 36 equivalent steps of current production technology, i.e. photo lithography.

Preferably, the backplane 40 forms part of a flat panel display device, though the application of the present invention is not so limited. For example, the method may also be used to produce radio and microwave antenna devices. Such devices typically require higher performance semiconductors than the organic semiconductors are capable of producing. In this case, for example, a carbon nanotube transistor (CNT) device may be substituted, in which the carbon nanotubes are deposited by an ink jet printing process or electrographic process, and suitably aligned using electrostatic forces. See U.S. patent application Ser. No. 11/423,917, and WO/US2006/138263, each of which is expressly incorporated herein by reference.

First Alternate Embodiment

Figure 2:
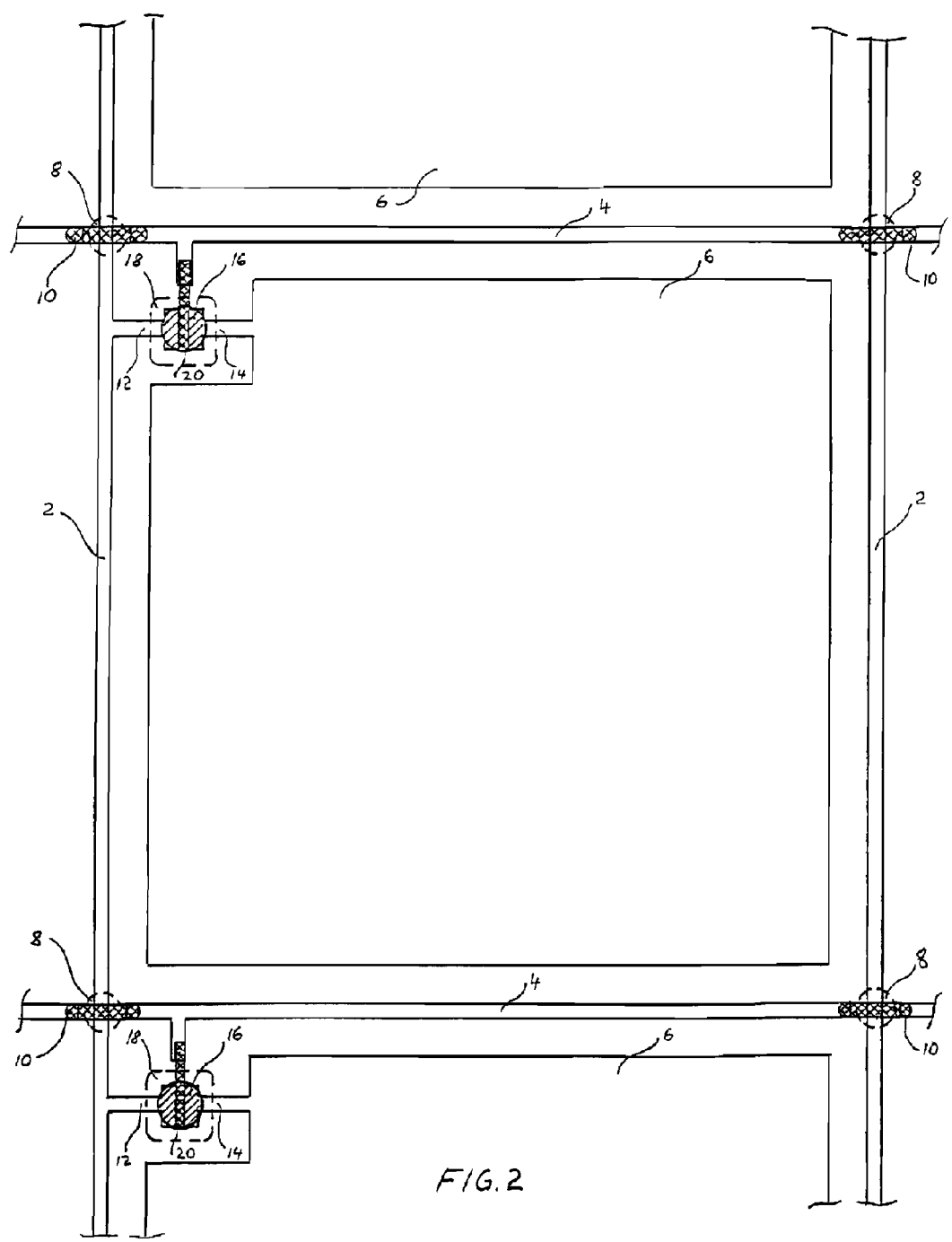
FIG. 2 shows a back plane made with one electrographic printing step and four ink jet printing steps, but depending upon the exact material set used, the latter can be reduced to three printing steps.
Figure 3:
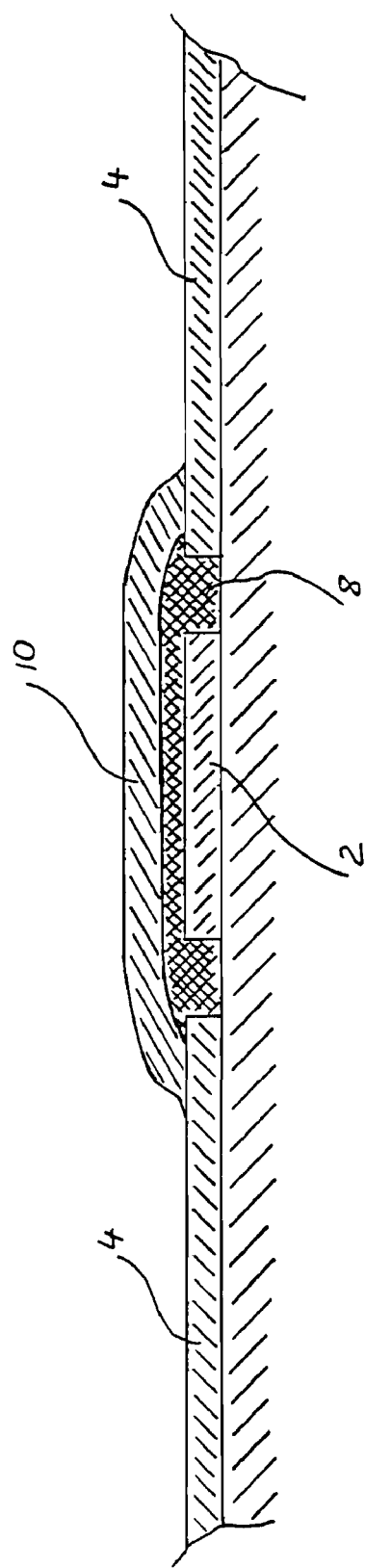
FIG. 3 shows a cross section of FIG. 2.

FIG. 2 shows an alternate embodiment in which there are four ink jet steps and one electrographic toner printing step. The first metal layer comprises column bus 2, with pixel electrode 6 and source electrode 12 and drain electrode 14. Also shown is interconnect 4, all in the first and only metal layer, formed similarly to steps 1-4 of the preferred embodiment. FIG. 3 shows a cross section of junction shown in FIG. 2. It shows source bus 2 and interconnect metal structure 4 over which dielectric layer 8 is ink jet printed in place, and subsequently, "bridging" metal layer 10 is ink jet printed over the metal layer and the dielectric layer 8. Thus, the entire metal structure (formerly requiring 3 electrographic toner printing steps) is accomplished in only one electrographic printing step, and two ink jet printing steps. Note that if the dielectric material 8 is the same as gate dielectric 18; then they may be deposited in a common ink jet printing operation, with one step eliminated. Also, if bridging metal 10 is compatible with gate electrode 20, then a second extra step is eliminated; so we have a compact 4 step process:
  a.) The first metal step 2, 4, 6, 12, 14
  b.) Ink jet #2, the semiconductor material 16
  c.) Ink jet #2, gate dielectric 18 and bridging dielectric 8
  d.) Ink jet #3, the gate electrode 20 and bridging metal 10
In these four steps, a backplane may be completed.

Second Alternate Embodiment

According to the second alternate embodiment, Electrokinetic Imaging is employed. This technique is described more fully in PCT WO/02/063397 and U.S. patent application Ser. No. 10/888,286, expressly incorporated herein by reference in its entirety.

FIG. 7 shows a grounded conductive substrate 70 to be patterned on the bottom, and a counter electrode 78 disposed opposite it, acting as a counter electrode suitably driven by an ac voltage 80 in the hundred to thousand volt range. A liquid toner 82 fills the gap in between the plates 80, 78. The liquid toner 82 filling the gap has a certain level of conductivity, that imparts a charge on the patterned photopolymer 72 due to a potential on the driven counter electrode 78. These charges attract toner particles 74 into the cavities of the patterned photopolymer 72 mask. See U.S. Pat. No. 6,815,139, expressly incorporated herein by reference.

Figure 8:
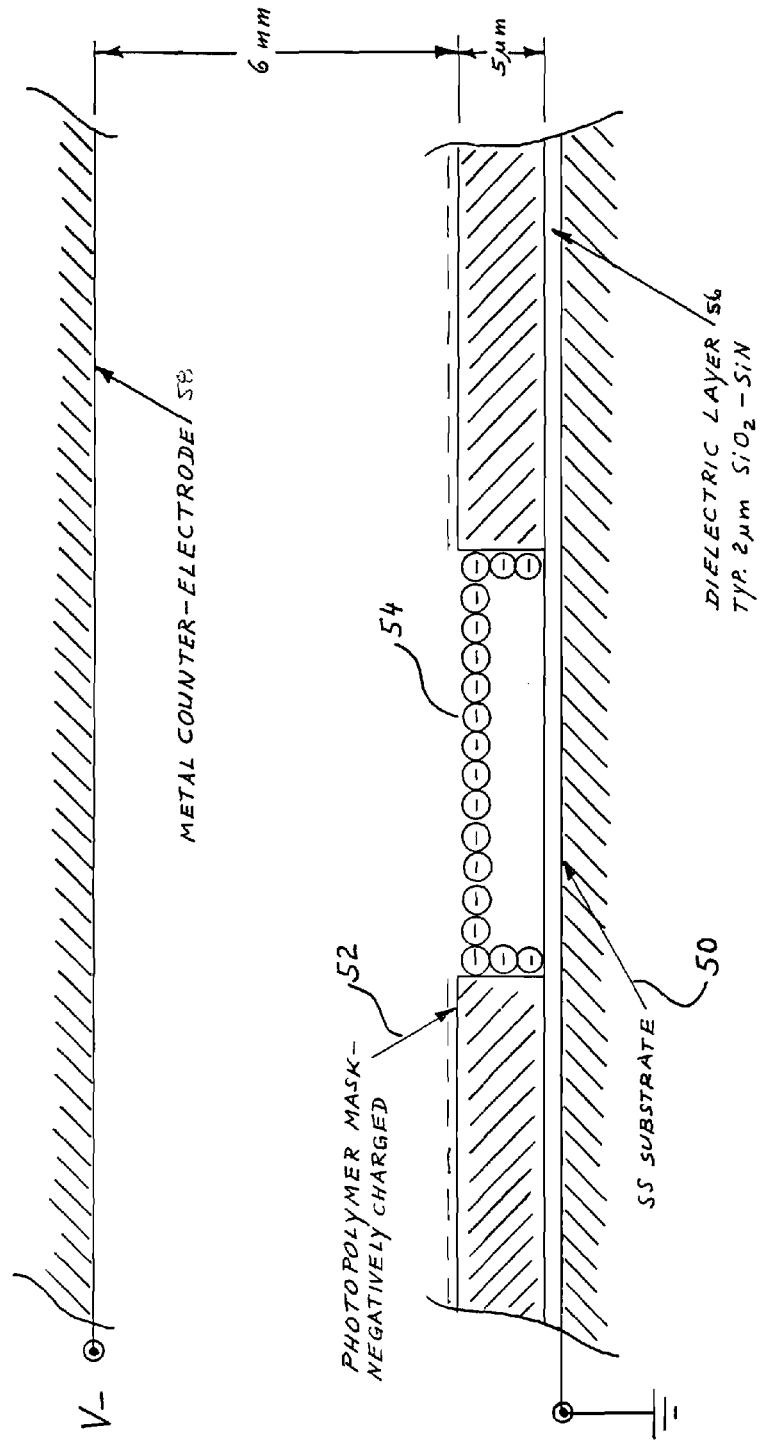
FIG. 8 shows the desired metallic structure to be built.

FIG. 8 shows the desired metallic structure to be built. The substrate 50, formed of stainless steel coated with an inorganic dielectric 56 is masked with a liquid photo polymer 52 (SU-8 epoxy; Micro Chemical Co Watertown, Mass.), yielding a film about 5 μ thick. This is mounted opposite a counter electrode 58, and the gap is filled with a suitable liquid toner containing particles 54. In this case the toner particles 54 are silver metal particles coated with a MOD coating (metallic Organic Decomposition product). Upon suitable heating, the organo-metallic compounds breakdown into the metallic ion, which sinters the particles together. Note, there is no resin contained in these particles which would interfere with the electrical conduction process. These toners are described in U.S. Pat. No. 6,036,889 (Kydd). The individual metal particles 54 are preferably about 200 nm in diameter, and with thermal processing of about 250° C. for 20 seconds yields about 30% of the conductivity of bulk silver.

After consolidation of the metal particles into a solid, sintered structure, the photo polymer mask can be washed away as desired, or it can remain in place.

Based on substrate requirements, substrate 60 in FIG. 4A may be coated with a sacrificial conductive layer 62 to provide the electrical ground plane required for electro-kinetic imaging. A photo-polymer is coated on top and is exposed to actinic radiation using a photo-tool, see FIG. 4B. After the latent image is developed to form trenches, and the trenches are imaged with conductive toner, see FIG. 5, the toner is cured to form a continuous trace. After the photo-polymer is stripped away, the sacrificial layer can be de-activated, i.e., made non-conductive, using suitable chemistry. Examples of suitable sacrificial materials are the poly[3,4]ethylene dioxythiophene (PEDOT materials from Agfa).

While the invention has been described in relation to the three embodiments, other variations and embodiments are anticipated that are obvious to those skilled in the art, and they are necessarily included in the spirit and scope of the invention.

What we claim is:

1. A method for the manufacture of an active matrix backplane, comprising:
   electrographically forming a first conductive layer comprising a set of conductive portions on an insulating substrate;
   forming a cross-over dielectric by a process selected from an electrographic process and a raster deposition process, at least a portion of the cross-over dielectric being formed on at least a portion of the first conductive layer;
   forming a second conductive layer by a process selected from an electrographic process and a raster deposition process, at least a portion of the second conductive layer being formed on at least a portion of the cross-over dielectric formed on at least a portion of the first conductive layer; and
   forming an active matrix backplane functional device comprising a semiconducting material portion, a gate dielectric, and a gate electrode by a raster deposition process, the functional device being electrically connected to at least one of the first conductive layer and the second conductive layer.

2. The method according to claim 1, wherein the cross-over dielectric and the second conductive layer are formed electographically.

3. The method according to claim 1, wherein the cross-over dielectric and the second conductive layer are formed by a raster deposition process.

4. The method according to claim 3, wherein the raster deposition process comprises an ink jet printing process.

5. The method according to claim 1, wherein the gate dielectric and the cross-over dielectric are formed concurrently by a raster deposition process.

6. The method according to claim 1, wherein the gate electrode and second conductive layer are formed concurrently by a raster deposition process.

7. The method according to claim 1, wherein the cross-over dielectric and the gate dielectric layer are formed concurrently by a first ink jet printing step, and the gate electrode and the second conductive layer are formed concurrently by a second ink jet printing step.

8. The method according to claim 1, wherein the semiconducting material portion comprises an organic semiconductor material deposited by an ink jet printing process.

9. The method according to claim 1, wherein the semiconducting material portion comprises an active current modulating material selected from one or more of the group consisting of a pentacene, a polythiophene and a poly aryl amine.

10. The method according to claim 1, wherein the semiconducting material comprises semiconducting, single wall carbon nanotubes.

11. The method according to claim 1, wherein said first conductive layer is formed electrographically, and said second conductive layer is formed by a process comprising selective deposition of liquid droplets, which are then solidified.

12. The method according to claim 1, wherein said insulating substrate comprises a photopolymer formed over a circuit pattern, which selectively retains charge in regions which have been exposed to light, said first conductive layer being formed electrographically and having a pattern corresponding to a light exposure of said photopolymer.

13. The method according to claim 1, wherein said second conductive layer is contiguous with the gate electrode and said cross-over dielectric is contiguous with said gate dielectric, selectively disposed to function as the gate and channel, respectively, of a field effect transistor.

14. The method according to claim 1, wherein said first and second conductive layers each comprise an elongated strip which respectively cross each other, separated by said cross-over dielectric.

15. The method according to claim 1, wherein said semiconducting material portion, said gate dielectric, and said gate electrode are formed as liquid droplets which are sequentially deposited by an ink jet process to form the functional device.

16. The method according to claim 1, wherein said cross-over dielectric comprises one or more materials selected from the group consisting of a polyester resin, a polyethylene resin, an epoxy, a ethylene acrylic acid co-polymer, and a ethylene vinyl acetate co-polymer.

17. The method according to claim 1, wherein at least one of said first and second conductive layers is formed from a metal organic decomposition product.

18. The method according to claim 1, further comprising depositing an electro-optic modulator composition configured to be selectively optically responsive to electrical signals within at least one of said first conductive layer and said second conductive layer.

19. The method according to claim 1, wherein said backplane comprises an antenna array, and wherein the functional device is configured to selectively interact with a radio frequency signal.

20. A method for manufacturing an active matrix device, comprising:
   electrographically forming a first conductive array pattern on an insulating substrate;
   forming a dielectric array pattern over portions of the first conductive array pattern, by a process selected from an electrographic process and a raster deposition process;
   forming a second conductive array pattern over at least portions of the dielectric array pattern by a process selected from an electrographic process and a raster deposition process;
   forming an array of functional devices, each comprising a channel material portion, and a gate portion, by a raster deposition process;
   wherein a channel material of a respective functional device of the array of functional devices is selectively modulated based on signals in the first and second conductive arrays.

21. The method according to claim 20, wherein the active matrix device comprises an active matrix display device, further comprising an array of electrooptically responsive material portions configured to provide a respective portion selectively responsive to a modulation of a respective functional device.

22. A method of forming an active matrix display device, comprising an array of rows and columns, having at each junction a cross-over dielectric separating the respective row and column electrodes, an active modulator selectively responsive to electrical signals in the row and column electrodes, and an electrically modulated optical composition, the method comprising:

electrographically forming a column conductive array pattern on an insulating substrate;

forming a cross-over dielectric array pattern over portions of the column conductive array pattern, by a process selected from an electrographic process and a raster deposition process;

forming a row conductive array pattern over at least portions of the dielectric array pattern by a process selected from an electrographic process and a raster deposition process;

forming an array of active modulators, each comprising a channel material portion, and a gate portion, by a raster deposition process, proximate to each junction; and depositing the electrically modulated optical composition configured to be selectively spatially modulated by the array of active modulators dependent on electrical signals in the column conductive array pattern and the row conductive array pattern.

\* \* \* \* \*